United States Patent
Kim et al.

(10) Patent No.: US 7,916,059 B2
(45) Date of Patent: Mar. 29, 2011

(54) DIGITAL-ANALOG CONVERSION DEVICE AND METHOD FOR THE DIGITAL-ANALOG CONVERSION

(75) Inventors: Tae-Woon Kim, Anyang-si (KR);
Shin-Young Yi, Seongnam-si (KR);
Sang-Hoon Lim, Jungnang-gu (KR);
Jin-Seok Koh, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/642,111

(22) Filed: Dec. 18, 2009

(65) Prior Publication Data
US 2010/0164775 A1 Jul. 1, 2010

(30) Foreign Application Priority Data
Dec. 30, 2008 (KR) .................. 10-2008-0137567

(51) Int. Cl.
*H03M 1/66* (2006.01)
(52) U.S. Cl. .................. 341/145; 341/144; 341/143
(58) Field of Classification Search .................. 341/143, 341/144, 145
See application file for complete search history.

(56) References Cited

U.S. PATENT DOCUMENTS

| 5,920,273 | A  | * | 7/1999  | Hirano         | 341/144 |
| 6,624,774 | B2 | * | 9/2003  | Takeda et al.  | 341/144 |
| 6,686,858 | B2 | * | 2/2004  | Nagao          | 341/144 |
| 7,292,219 | B2 | * | 11/2007 | Sun            | 345/100 |

* cited by examiner

*Primary Examiner* — Jean B Jeanglaude
(74) *Attorney, Agent, or Firm* — Sherr & Vaughn, PLLC

(57) ABSTRACT

A digital-analog conversion circuit, a method for the digital-analog conversion and a source driver are disclosed. A digital-analog conversion circuit may include a latch for storing N bit digital data therein, and a digital-analog converter, for performing a first digital-analog conversion on predetermined bits out of the N bit data stored in the latch by using R-string conversion, and for performing a second digital-analog conversion based on a result of the first digital-analog conversion and all remaining bits of the N bit data, excluding the predetermined bits.

20 Claims, 4 Drawing Sheets

DIGITAL-ANALOG CONVERSION DEVICE AND METHOD FOR THE DIGITAL-ANALOG CONVERSION

The present application claims priority under 35 U.S.C. 119 to Korean Patent Application No. 10-2008-0137567 (filed on Dec. 30, 2008), which is hereby incorporated by reference in its entirety.

BACKGROUND

A source driver for driving a liquid crystal display (LCD) may use an R-string DAC (resistance-string digital to analog converter). Such an R-string DAC used to represent the source driver may represent up to 8 bits. However, in higher resolution cases, with more than 10 bits, the number of routings and resistances which may be required increases as $2^N$ (where N is the number of bits). Thus an area on a chip taken up by the R-string DAC will increase drastically. For this reason, the R-string DAC is not practical for high resolution.

Figure 1:
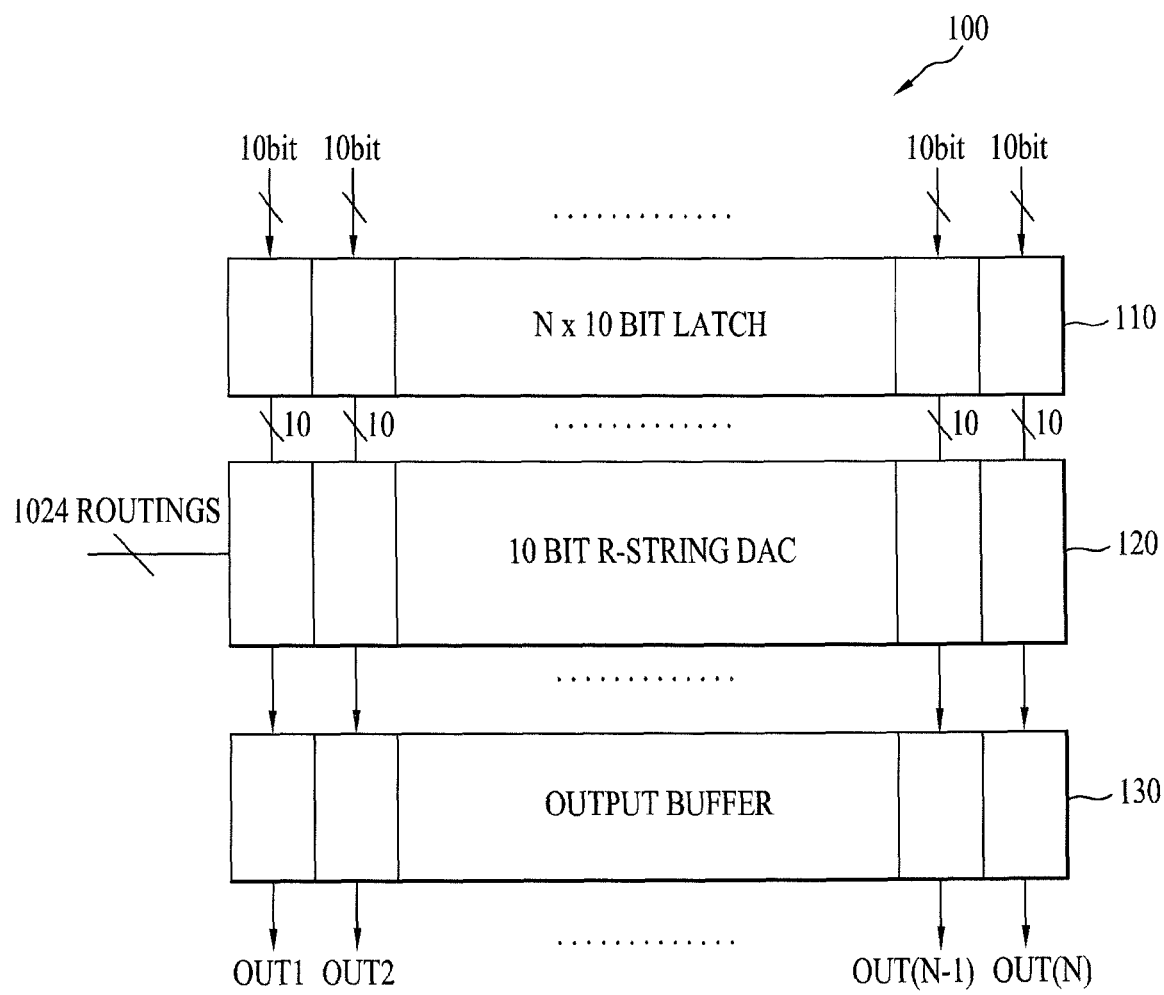

FIG. 1 is a diagram illustrating a source driver 100 including a related 10 bit R-string DAC. In reference to FIG. 1, the source driver 100 includes a latch 110 for latching data, a DAC 120 generating an analog signal corresponding to the digital data stored in the latch and an output buffer 130 for outputting the analog signal to source lines (OUT1~OUT(N)).

The number of the routings and resistances required to fabricate the 10-bit source driver using the R-string DAC may be 1024. In addition, 1024 switches are required to select a value of the R-string for each column. As a result, an area of a chip occupied by the R-string DAC will increase drastically.

SUMMARY

Embodiments relate to a digital-analog conversion circuit for high resolution, a method for the digital-analog conversion and a source driver. Embodiments relate to a digital-analog conversion circuit for high resolution that is able to reduce a chip size and to improve settling time, and a method for the digital-analog conversion and a source driver.

Embodiments relate to a digital-analog conversion circuit which may include a latch for storing N bit digital data therein, wherein N is a positive real number. The circuit may further include digital-analog converter, for performing a first digital-analog conversion on predetermined bits out of the N bit data stored in the latch by using R-string conversion, and for performing a second digital-analog conversion based on a result of the first digital-analog conversion and all remaining bits of the N bit data, excluding the predetermined bits. Embodiments also relate to a source driver, including the digital-analog conversion circuit, and further including an output buffer for buffering the analog signal and for outputting the result of the buffering.

Embodiments relate to a method for digital-analog conversion which may include: storing N bit digital data, wherein N is a positive real number; performing a first digital-analog conversion, using R-string conversion, based on predetermined bits out of the stored N bit data; and performing a second digital-analog conversion, using delta-sigma conversion, based on a result of the first digital-analog conversion and all remaining bits of the N bit data, excluding the predetermined bits.

Embodiments may have allow a reduced chip size and an improved settling time when representing high resolution, because embodiments mixedly use the R-string conversion and the delta-sigma conversion.

DRAWINGS

FIG. 1 is a diagram illustrating a source driver including a related 10-bit R-string DAC.

Figure 2:
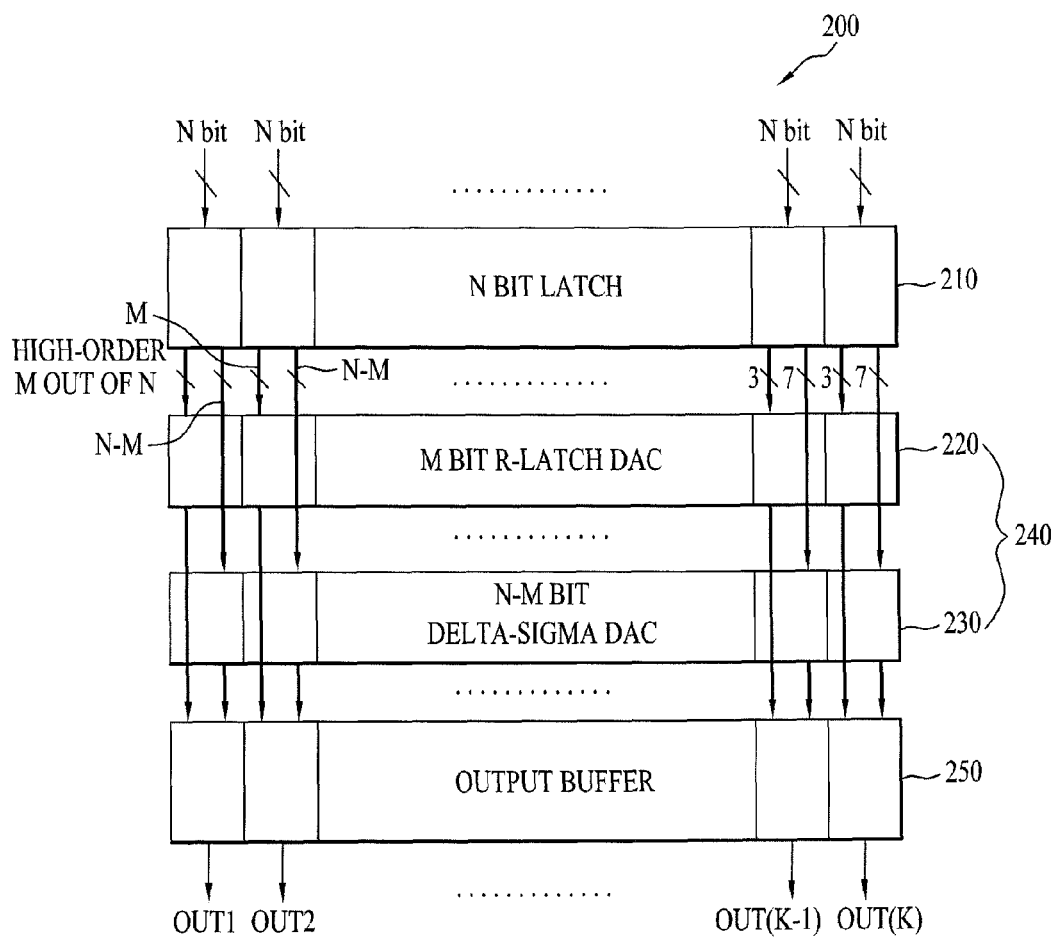

Example FIG. 2 is a diagram illustrating a source driver according to embodiments.

Figure 3:
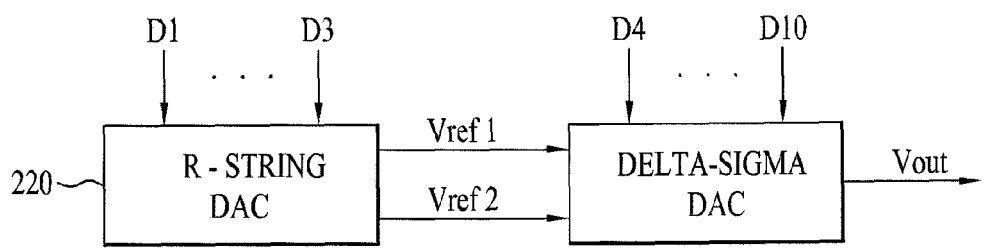

Example FIG. 3 is a diagram illustrating a digital-analog converter shown in example FIG. 2.

Figure 4:
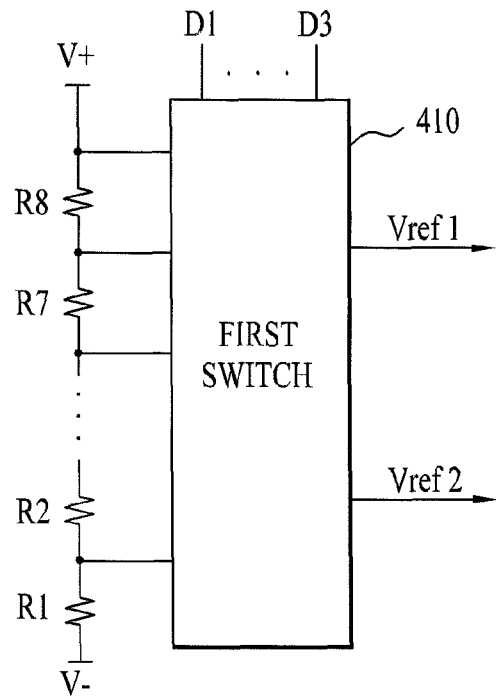

Example FIG. 4 is a diagram illustrating a R-string DAC shown in example FIG. 3.

Figure 5:
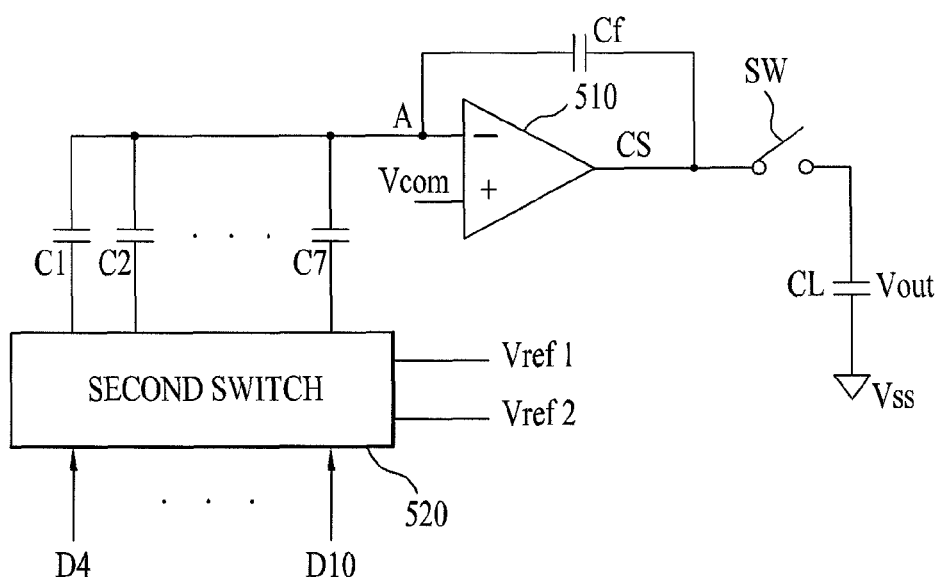

Example FIG. 5 is a diagram illustrating a delta-sigma DAC shown in example FIG. 3.

Figure 6:
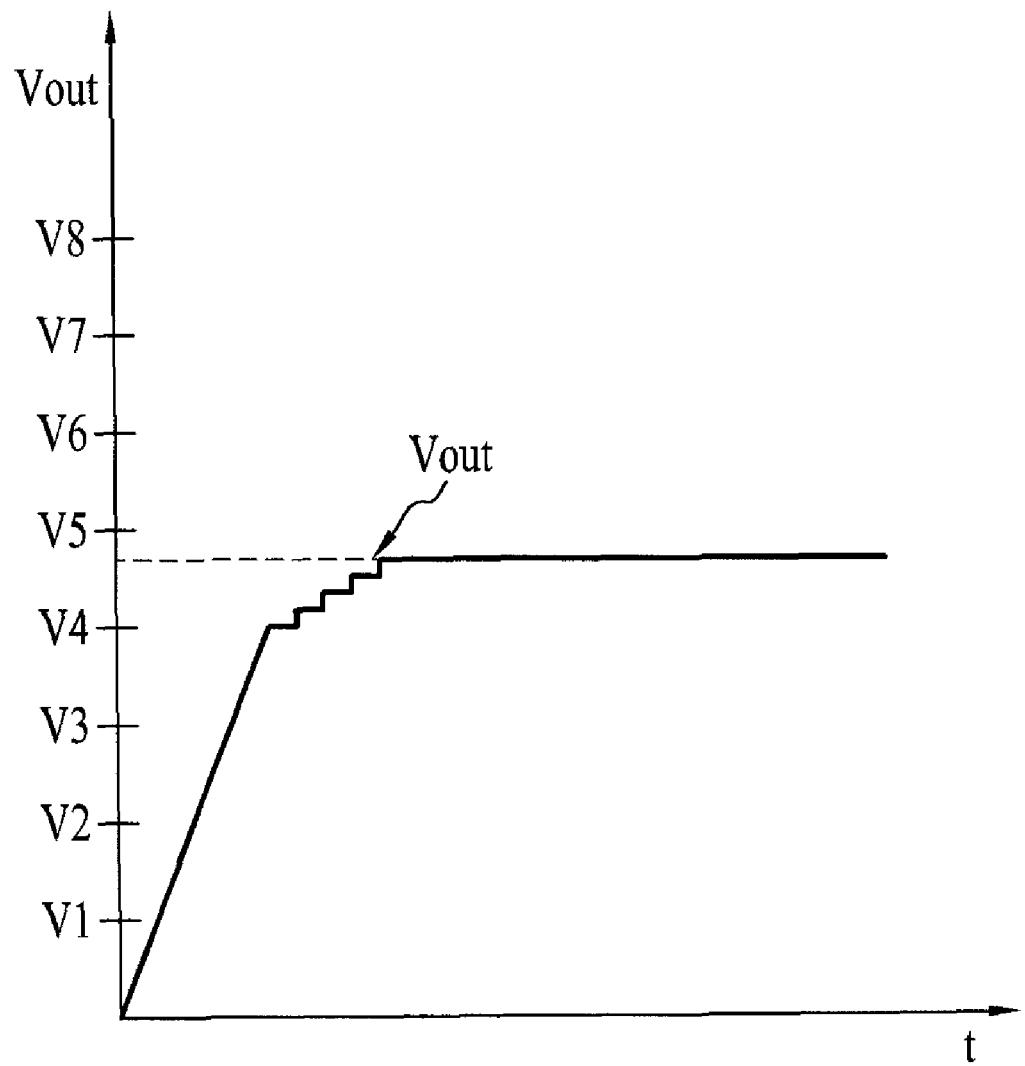

Example FIG. 6 is a graph illustrating final output of the digital-analog converter shown in example FIG. 2.

DESCRIPTION

Example FIG. 2 is a diagram illustrating a source driver 200 according to embodiments. In reference to example FIG. 2, the source driver 200 may include a latch 210, a digital-analog converter 240 and an output buffer 250. The latch 210 latches a plurality of N-bit data. Here, 'N' is a positive real number.

The digital-analog converter 240 may perform a first digital-analog conversion and a second digital-analog conversion. The first digital-analog conversion may be performed based on a predetermined number of bits out of the N-bit data by using R-string conversion. The second digital-analog conversion may be performed based on the result of the first digital-analog conversion and the other bits out of the N-bit data.

The digital-analog converter 240 may include an M-bit R-string DAC 220 and N-M bit delta-sigma DAC 230. Here, 'M' is a positive real number that is smaller than 'N'. The M-bit R-string DAC 220 performs the first digital-analog conversion based on a high-order M-bit out of the N-bit data stored in the latch 210 by using R-string conversion. The N-M bit delta-sigma DAC 230 performs the second digital-analog conversion based on the other N-M bits out of the N bit data stored in the latch 210 and the result of the first digital-analog conversion by using delta-sigma conversion.

Example FIG. 3 is a diagram illustrating the digital-analog converter 240 shown in example FIG. 2. In reference to example FIG. 3, the R-string DAC 220 may generate a first reference voltage (Vref1) and a second reference voltage (Vref2) based on a high-order 3 bit data out of the 10 bit data stored in the latch 210.

For example, if the high-order 3 bit data is 110, the R-string DAC 220 may output a first reference voltage (Vref1) corresponding to the high-order 3 bit data 110 and a second reference voltage (Vref2) corresponding to a low-order data 101 of the high-order 3 bit. If a driving voltage of the source driver is 18V and the high-order bit data is 110, the first reference voltage (Vref1) may be 11.25V (=18×⅝) and the second reference voltage (Vref2) may be 9V (=18×⅘).

Example FIG. 4 is a diagram illustrating the R-string DAC 220 shown in example FIG. 3. In reference to example FIG. 4, the R-string DAC 220 may include a plurality of resistances, for example, R1 to R8 and a first switch 410. The plurality of the resistances, for example, R1 to R8 may be connected between a first voltage (V−) and a second voltage (V+) in series. The first switch 410 may be connected to each connection node between the plural resistances, for example, R1 to R8, which are connected to each other. The first switch 410 switches these nodes to output the first reference voltage (Vref1) and the second reference voltage (Vref2) based on the high-order M bit data (D1, D2 and D3) out of the N bit data.

The delta-signal DAC 230 outputs an analog signal (Vout) based on the other N-M bit data (in this example, D4 to D10) by using the first and second reference voltages (Vref1 and Vref2) as reference voltage. Example FIG. 5 is a diagram illustrating the delta-sigma DAC 230 shown in example FIG. 3. In reference to example FIG. 5, the delta-signal DAC 230 may include a comparator 510, a plurality of capacitors (C1 to C7), a second switch 520, a feedback capacitor (Cf), a load capacitor (CL) and a load switch (SW).

An end of each capacitor (C1 to C7) may be connected to a first input terminal, for example, a negative input terminal (−) and a common voltage (Vcom) may be applied to a second input terminal, for example, a positive input terminal (+) of the comparator 510. The second switch 520 may be switched to apply the first reference voltage (Vref1) or the second reference voltage (Vref2) to the other end of each capacitor (C1 to C7) based on the other N-M bit data.

A voltage of a first node (A) is determined by the operation of the second switch 520 and the voltage fed back by the feedback capacitor (Cf). The comparator 510 compares the voltage of the first node (A) to the common voltage (Vcom) and it outputs a comparison signal (CS) based on the result of the comparison. Here, the first node (A) is a node enabling each end of the plural capacitors (C1 to C7), the first input terminal of the comparator 510 and the feedback capacitor (Cf) connected to each other. The load switch (SW) samples the comparison signal (SC) output from the comparator 510. The sampled signal charges the load capacitor (CL).

As shown in example FIG. 5, 7 bit delta-sigma conversion may be performed by using the output of the R-string DAC 220 as reference voltage. As a result, the output of the delta-sigma DAC 230 has a value between the first reference voltage (Vref1) and the second reference voltage (Vref2) based on the other 7 bit (D4 to D10).

Example FIG. 6 is a graph illustrating final output of the digital-analog converter shown in example FIG. 2. In reference to example FIG. 6, V5 of the first reference voltage (Vref1) and V4 of the second reference voltage (Vref2) may be determined by the R-string DAC 220 and the final output (Vout) may be determined to be between V4 and V5 by the delta-sigma DAC 230.

The output buffer 250 buffers the analog signal converted by the digital-analog converter 240 and outputs the result of the buffering to the source lines (OUT1~OUT (K)). Here, 'K' may be a natural number.

As shown in example FIG. 2, according to embodiments, to convert the 10 bit digital data into an analog signal, the high-order 3 bit data out of the 10 bit digital data is represented by the R-string DAC 220, and the other 7 bit data is represented by the delta-sigma DAC 230. As a result, embodiments may reduce the chip area in comparison to the representation of the 10 bit R-string DAC. In addition, embodiments may enable a faster settling time in comparison to the representation of only the 10 bit delta-sigma DAC.

In the design of a 7 bit delta-sigma DAC, SNR (Signal to Noise Ratio) may be mitigated to approximately 20 dB. As a result, a mitigated over-sampling rate of a digital modulator and a mitigated design of an analog output filter may be embodied. Therefore, if the mixed structure, with the R-string DAC and the delta-sigma DAC, is used in representing the source driver for high resolution according to embodiments, the increased area occupied on a chip that is a disadvantage of the R-string may be solved. In addition, the settling time that is a disadvantage of the delta-sigma DAC may be improved. Here, a basic function of the verified R-string DAC may be useable.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a latch for storing N bit digital data therein, wherein N is a positive real number; and
    a digital-analog converter, for performing a first digital-analog conversion on predetermined bits out of the N bit data stored in the latch by using R-string conversion, and for performing a second digital-analog conversion based on a result of the first digital-analog conversion and all remaining bits of the N bit data, excluding the predetermined bits.

2. The apparatus of claim 1, wherein the digital-analog converter comprises an R-string DAC for performing the first digital-analog conversion based on M bit data, wherein the M bit data is the predetermined bits which include a high-order subset of the N bit data stored in the latch.

3. The apparatus of claim 2, wherein the digital-analog converter comprises a delta-sigma DAC for performing the second digital-analog conversion based on remaining N-M bit data and the result of the first digital-analog conversion, wherein the remaining N-M bit data is all lower order N bit data excluding the high-order M bit data.

4. The apparatus of claim 3, wherein the R-string DAC generates a first reference voltage and a second reference voltage based on the M bit data.

5. The apparatus of claim 4, wherein the delta-sigma DAC outputs an analog signal, based on the N-M bit data, using the first and second reference voltages as reference voltages.

6. The apparatus of claim 2, wherein N is 10 and M is 3.

7. The apparatus of claim 2, wherein the R-string DAC includes a plurality of resistors connected in series between a first R-string driving voltage and a second R-string driving voltage.

8. The apparatus of claim 7, wherein connections between the resistors form a series of nodes, and the R-string DAC includes a switch connected to each of the nodes.

9. The apparatus of claim 8, wherein the switch outputs a first reference voltage and a second reference voltage based on the high-order M bit data.

10. The apparatus of claim 9, wherein the first reference voltage and a second reference voltage are fractional values of the voltage difference between first R-string driving voltage and the second R-string driving voltage.

11. The apparatus of claim 10, wherein the denominator of the fractional values is based on the number of resistors in the R-string.

12. The apparatus of claim 10, wherein the denominator of the fractional values is $2^M$.

13. A method comprising:
    storing N bit digital data, wherein N is a positive real number;
    performing a first digital-analog conversion, using R-string conversion, based on predetermined bits out of the stored N bit data; and
    performing a second digital-analog conversion, using delta-sigma conversion, based on a result of the first digital-analog conversion and all remaining bits of the N bit data, excluding the predetermined bits.

14. The method of claim 13, wherein performing the first digital-analog conversion generates a first reference voltage and a second reference voltage based on M bit data, wherein the M bit data is the predetermined bits, which are a high-order subset of the stored N bit data.

15. The method of claim 14, wherein performing the second digital-analog conversion outputs an analog signal using the delta-sigma conversion, based on remaining N-M bit data, wherein the remaining N-M bit data is all lower order N bit data excluding the high-order M bit data, using the first and second reference voltages as reference voltage.

16. An apparatus comprising:
   a latch for storing N bit digital data therein, wherein N is a positive real number;
   a digital-analog converter, for performing a first digital-analog conversion on predetermined bits out of the N bit data stored in the latch by using R-string conversion, and for performing a second digital-analog conversion based on a result of the first digital-analog conversion and remaining bits, not including the predetermined bits, out of the N bit data; and
   an output buffer for buffering the analog signal and for outputting the result of the buffering.

17. The apparatus of claim 16, wherein the digital-analog converter includes:
   an R-string DAC for performing the first digital-analog conversion based on M bit data, wherein the M bit data is the predetermined bits which include a high-order subset of the N bit data stored in the latch; and
   a delta-sigma DAC for performing the second digital-analog conversion based on remaining N-M bit data and the result of the first digital-analog conversion, wherein the remaining N-M bit data is all lower order N bit data excluding the high-order M bit data.

18. The apparatus of claim 17, wherein the R-string DAC generates a first reference voltage and a second reference voltage based on the M bit data.

19. The apparatus of claim 18, wherein the delta-sigma DAC outputs an analog signal, based on the N-M bit data, using the first and second reference voltages as reference voltages.

20. The apparatus of claim 17, wherein the R-string DAC includes a plurality of resistances connected in series between a first R-string driving voltage and a second R-string driving voltage.

* * * * *